(12) United States Patent
Hsiao et al.

(10) Patent No.: US 7,553,763 B2
(45) Date of Patent: Jun. 30, 2009

(54) SALICIDE PROCESS UTILIZING A CLUSTER ION IMPLANTATION PROCESS

(75) Inventors: Tsai-Fu Hsiao, Hsin-Chu (TW);
Chin-Cheng Chien, Hsin-Chu (TW);
Kuo-Tai Huang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 94 days.

(21) Appl. No.: 11/463,012

(22) Filed: Aug. 8, 2006

(65) Prior Publication Data

US 2007/0037373 A1  Feb. 15, 2007

Related U.S. Application Data

(60) Provisional application No. 60/595,839, filed on Aug. 9, 2005.

(51) Int. Cl.
*H01L 21/20* (2006.01)
(52) U.S. Cl. ............... 438/659; 438/672; 438/673; 438/692; 438/723; 438/724; 257/E21.165; 257/E21.169; 257/E21.315; 257/E21.438; 257/E21.585
(58) Field of Classification Search ............... 438/766, 438/506, 482, 197, 592, 624–632, 659, 723, 438/724, 782, 792; 257/E21.165, 169, 315, 257/438, 546, 584, 585, 661
See application file for complete search history.

(56) References Cited

U.S. PATENT DOCUMENTS

| | | | | | |
|---|---|---|---|---|---|
| 5,500,537 | A | * | 3/1996 | Tsumura et al. | 257/40 |
| 5,514,880 | A | * | 5/1996 | Nishimura et al. | 257/70 |
| 5,561,326 | A | * | 10/1996 | Ito et al. | 257/751 |
| 5,990,493 | A | * | 11/1999 | Gardner et al. | 257/77 |
| 6,013,332 | A | * | 1/2000 | Goto et al. | 427/530 |
| 6,030,863 | A | * | 2/2000 | Chang et al. | 438/229 |
| 6,072,222 | A | * | 6/2000 | Nistler | 257/383 |
| 7,105,412 | B1 | * | 9/2006 | Chen | 438/303 |
| 2004/0002202 | A1 | * | 1/2004 | Horsky et al. | 438/515 |
| 2005/0202657 | A1 | * | 9/2005 | Borland et al. | 438/514 |
| 2007/0246832 | A1 | * | 10/2007 | Odagawa et al. | 257/763 |

* cited by examiner

*Primary Examiner*—Michael S Lebentritt
(74) *Attorney, Agent, or Firm*—Winston Hsu

(57) ABSTRACT

A salicide process contains providing a silicon substrate that comprises at least a predetermined salicide region, performing a cluster ion implantation process to form an amorphized layer in the predetermined salicide region of the silicon substrate near, forming a metal layer on the surface of the amorphized layer, and reacting the metal layer with the amorphized layer to form a silicide layer on the surface of the silicon substrate.

26 Claims, 22 Drawing Sheets

SALICIDE PROCESS UTILIZING A CLUSTER ION IMPLANTATION PROCESS

CROSS REFERENCE TO RELATED APPLICATIONS

This application claims the benefit of the filing date of U.S. provisional patent application No. 60/595,839, filed Aug. 9, 2005, the contents of which are hereby incorporated by reference.

BACKGROUND OF THE INVENTION

1. Field of the Invention

The present invention relates to a salicide process, and more particular, to a salicide process utilizing a cluster ion implantation process.

2. Description of the Prior Art

Metal oxide semiconductor (MOS) transistors are key elements of current semiconductor products. A MOS transistor is formed with a gate, a source, and a drain. By providing a gate voltage larger than the threshold voltage of the MOS transistor, the drain and source will be conducted so as to meet the operation purpose of the MOS transistor. Therefore, the electrical performance of MOS transistors represents the quality of the MOS transistors.

As known in the art, silicide is a typical contact material used to reduce contact resistance of a MOS transistor. FIGS. 1-4 are schematic diagrams showing the typical silicide process. As shown in FIG. 1, a gate electrode 12 is formed on a substrate 10 with a gate insulating layer 14 interposed therebetween. Next, an ion implantation process, which decreases the thermal budget, is performed, to form source/drain extensions 16 (also called lightly doped drains, LDD) are formed in the substrate 10 of the two lateral sides of the gate electrode 12. Spacers 18 are formed around the gate electrode 12. Then, the gate electrode 12 and the spacers 18 are utilized as masks and an ion implantation process is processed to form the source/drain 20 in the substrate 10.

Subsequently, as shown in FIG. 2, a pre-amorphization implant (PAI) process 22 is carried out to form an amorphized layer 24 on in the substrate 10 near its surface. As shown in FIG. 3, a metal layer 26 is then sputtered onto the substrate 10. Finally, as shown in FIG. 4, a rapid thermal process (RTP) may be performed to react the metal layer 26 with the substrate 10 and the gate electrode 12 to form silicide layers 28. The un-reacted metal of the metal layer 26 is then removed from the surface of the substrate 10 by a wet etching process.

As known in the art, silicide such as titanium silicide ($TiSi_2$) is a typical material used to reduce contact resistance. It is also known that $TiSi_2$ exists as a C49 phase or as a C54 phase. When using the general processing conditions for forming $TiSi_2$, the less desirable, higher-resistivity C49 phase is formed first. In order to obtain the lower-resistivity C54 phase, a second high-temperature annealing step is required. Besides, the titanium silicide process is flawed because each titanium atom consumes two silicon atoms to form the titanium silicide. To cope with the difficulties arose due to the use of titanium silicide, nickel (Ni) has been used to replace titanium in the silicide process. Therefore, currently, the metal layer 26 may be a nickel layer, thus the temperature of the RTP for producing the nickel silicide layer 28 can be lowered.

On the other hand, during the PAI process, a monomer ion beam method is utilized. Referring to FIG. 5, which is a schematic diagram of a traditional PAI method utilizing monomer ion beam method. The traditional monomer ion beam method transfers gas including germanium (Ge), argon (Ar) or indium (In) into a plasma device, trough an extractor and an accelerator, for producing a monomer ion beam implanted into the substrate 10. However, the amorphized layer 24 formed with the traditional PAI method has a deep depth, forming continuous amorphous layer and causing defects at the end of the range of implantation, which is called end-of-range (EOR) defect, as shown in FIG. 5. The EOR defect caused by the traditional monomer ion beam method cannot be recovered in the following low-temperature thermal process and will cause junction leak. Accordingly, the sequentially formed nickel silicide layer 28 will result in time-dependent dielectric breakdown (TDDB) fail because there is no enough thermal budget to recover. Furthermore, the nickel silicide layer 28 formed from the reaction of the metal layer 26 and the amorphized layer 24, formed with the traditional PAI method, is un-uniform so that spiking or piping effects are easily occurred.

In light of the above, there is still a need to provide an improved method to fabricate a MOS transistor with silicided source and drain with preferable performance.

SUMMARY OF THE INVENTION

It is therefore a primary objective of the claimed invention to provided a method of self-aligned silicide (salicide) process for fabricating a MOS transistor to solve the above-mentioned problem.

According to the claimed invention, a salicide process is provided. The salicide process comprises providing a semiconductor substrate that comprises at least a predetermined salicide region, performing a cluster ion implantation process to form an amorphized layer in the predetermined salicide region, forming a metal layer on the surface of the amorphized layer, and reacting the metal layer with the amorphized layer to form a silicide layer on the surface of the semiconductor substrate. Wherein, the material of the metal layer is capable of forming a silicide material.

According to the claimed invention, a method of forming a metal-oxide semiconductor transistor comprises providing a semiconductor substrate comprising a gate electrode and a gate insulating layer thereon, performing an ion implantation process to form source/drain regions in the semiconductor substrate near the gate electrode, performing a cluster ion implantation process to form at least an amorphized layer in the source/drain regions, wherein the amorphized layer is positioned near the gate electrode and the surface of the semiconductor substrate. The method further comprises forming a metal layer, capable of forming a silicide material, on the surface of the amorphized layer, and reacting the metal layer with the amorphized layer to form a silicide layer on the surface of the semiconductor substrate.

According to the claimed invention, a method of forming a metal-oxide semiconductor transistor is further provided. The method comprises providing a substrate comprising a gate electrode and a gate insulating layer thereon, performing an ion implantation process to form source/drain regions in the semiconductor substrate near the gate electrode, forming at least an amorphous silicon layer on the substrate by a selective epitaxial growth process, performing a cluster ion implantation process to form at least an amorphized layer over the amorphous silicon layer, forming a metal layer, capable of forming a silicide material, on the surface of the amorphized layer, and reacting the metal layer with the amorphized layers to form a silicide layer on the surface of the gate electrode and the substrate.

It is an advantage of the present invention that the amorphized layer formed by the cluster ion implantation process is shallow so that the EOR effect in the prior-art method is proved. Therefore, the thermal treatment process with low temperature process can recover the defects of the following formed silicide layer to provide a silicide layer with a preferable quality and a low resistivity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
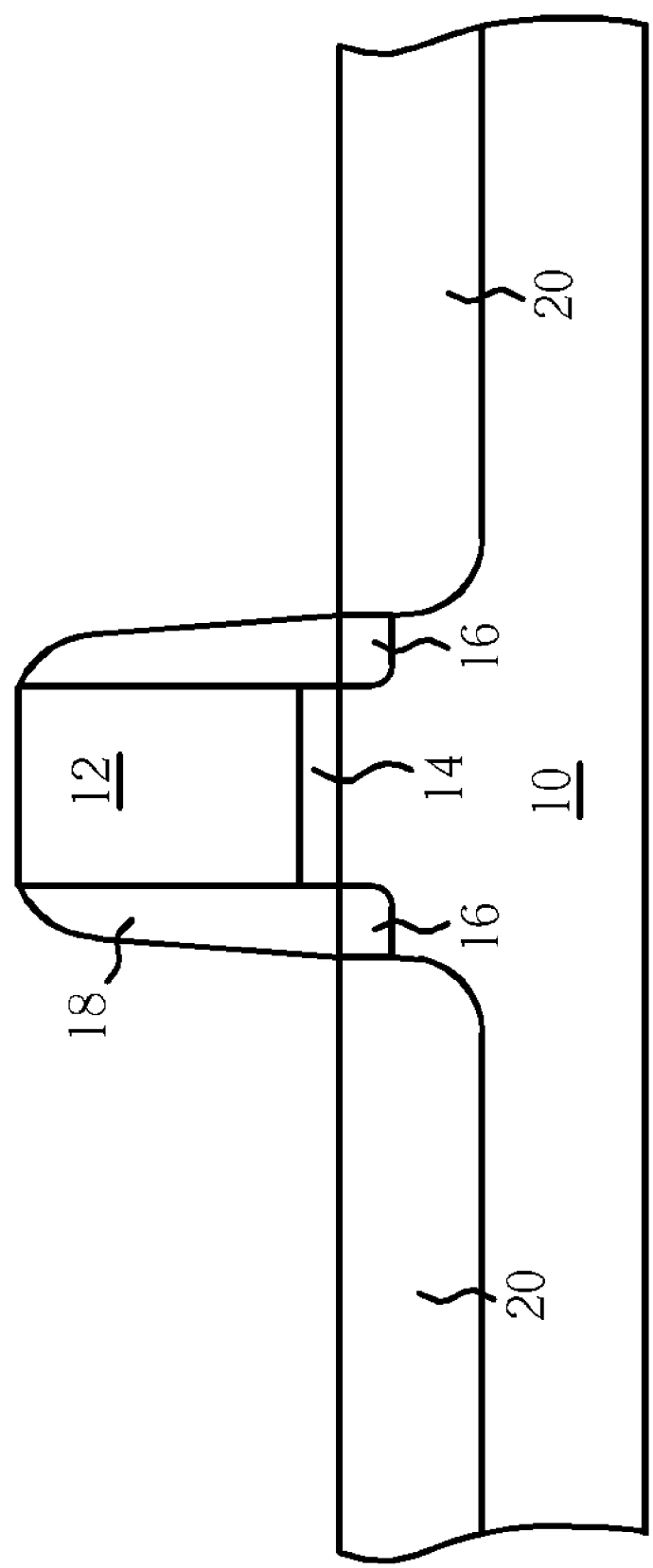
FIGS. 1-4 are schematic diagrams of forming a silicide layer according to the prior art.
Figure 2:
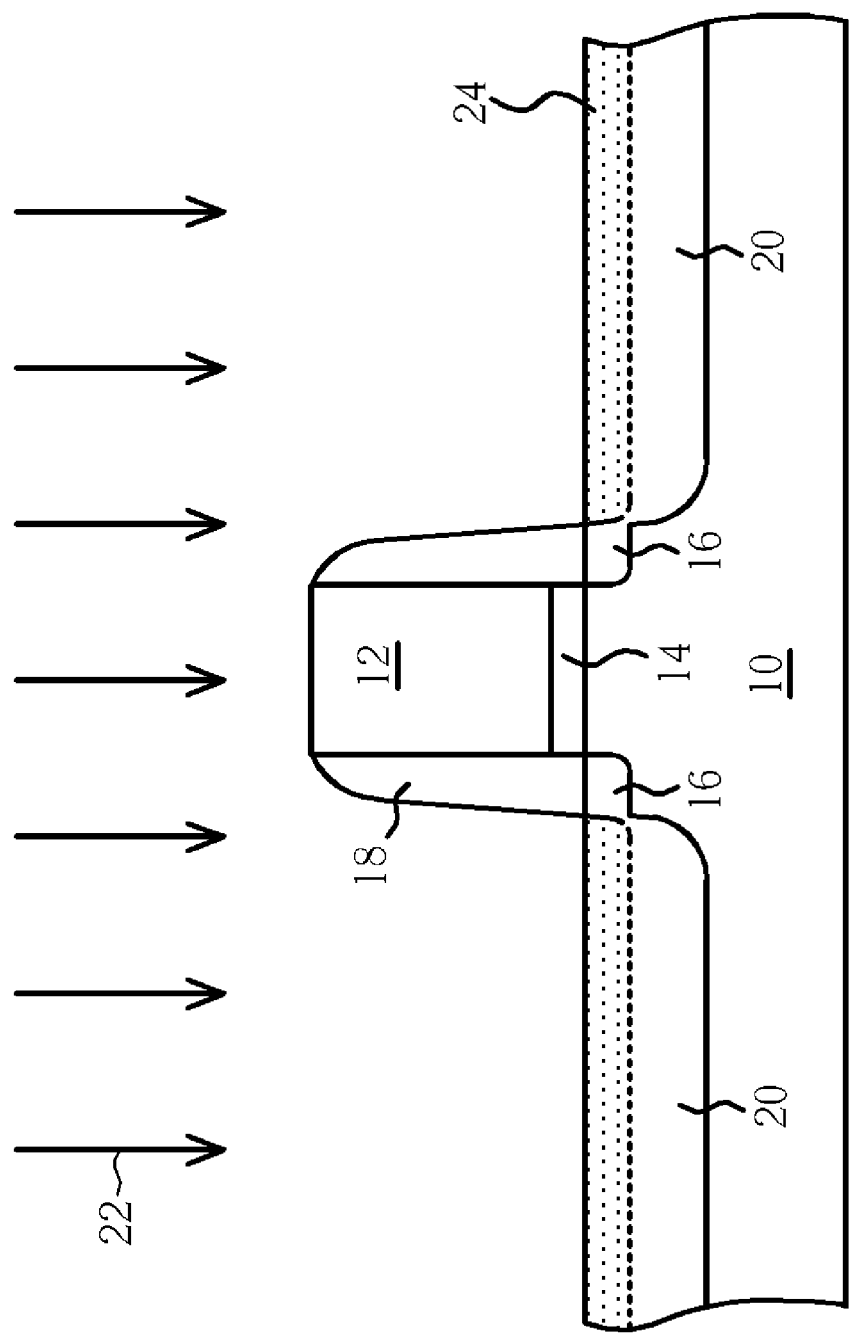
Figure 3:
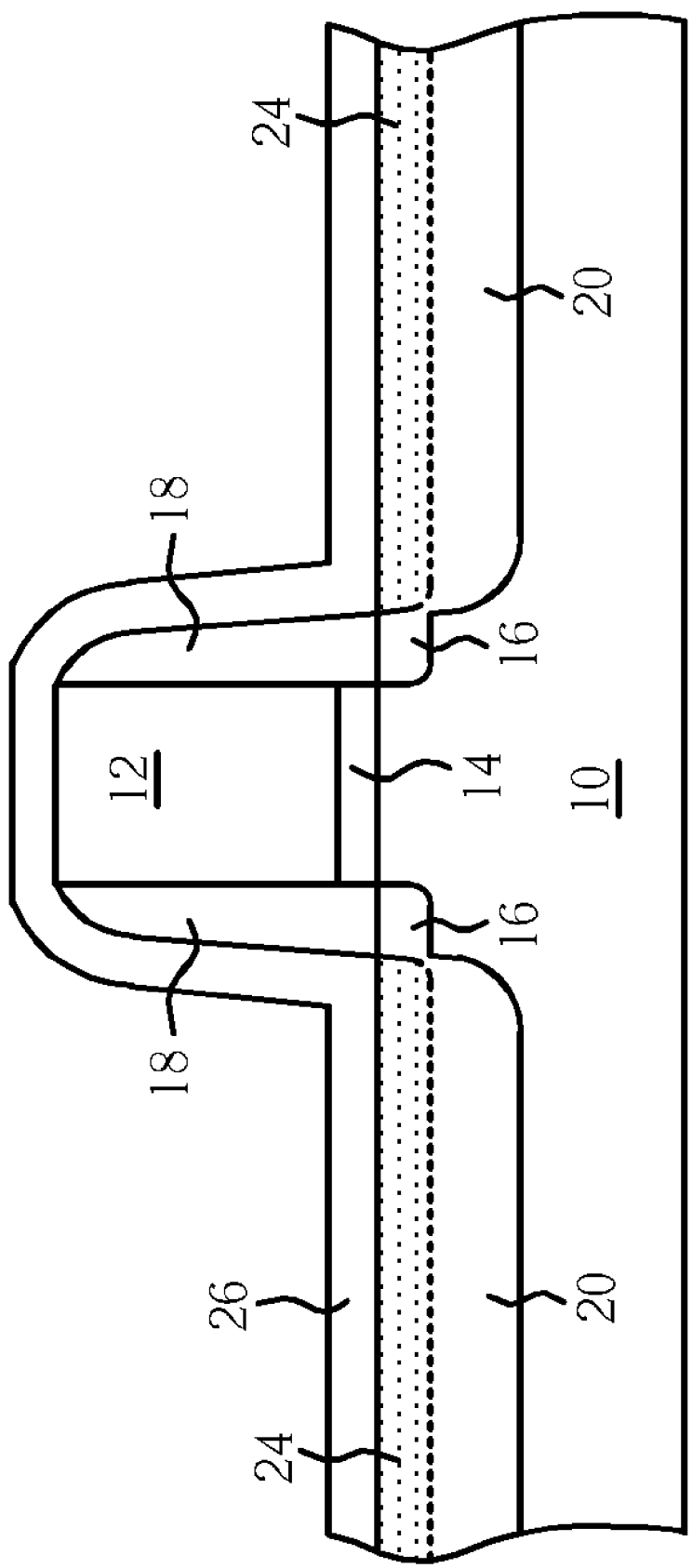
Figure 4:
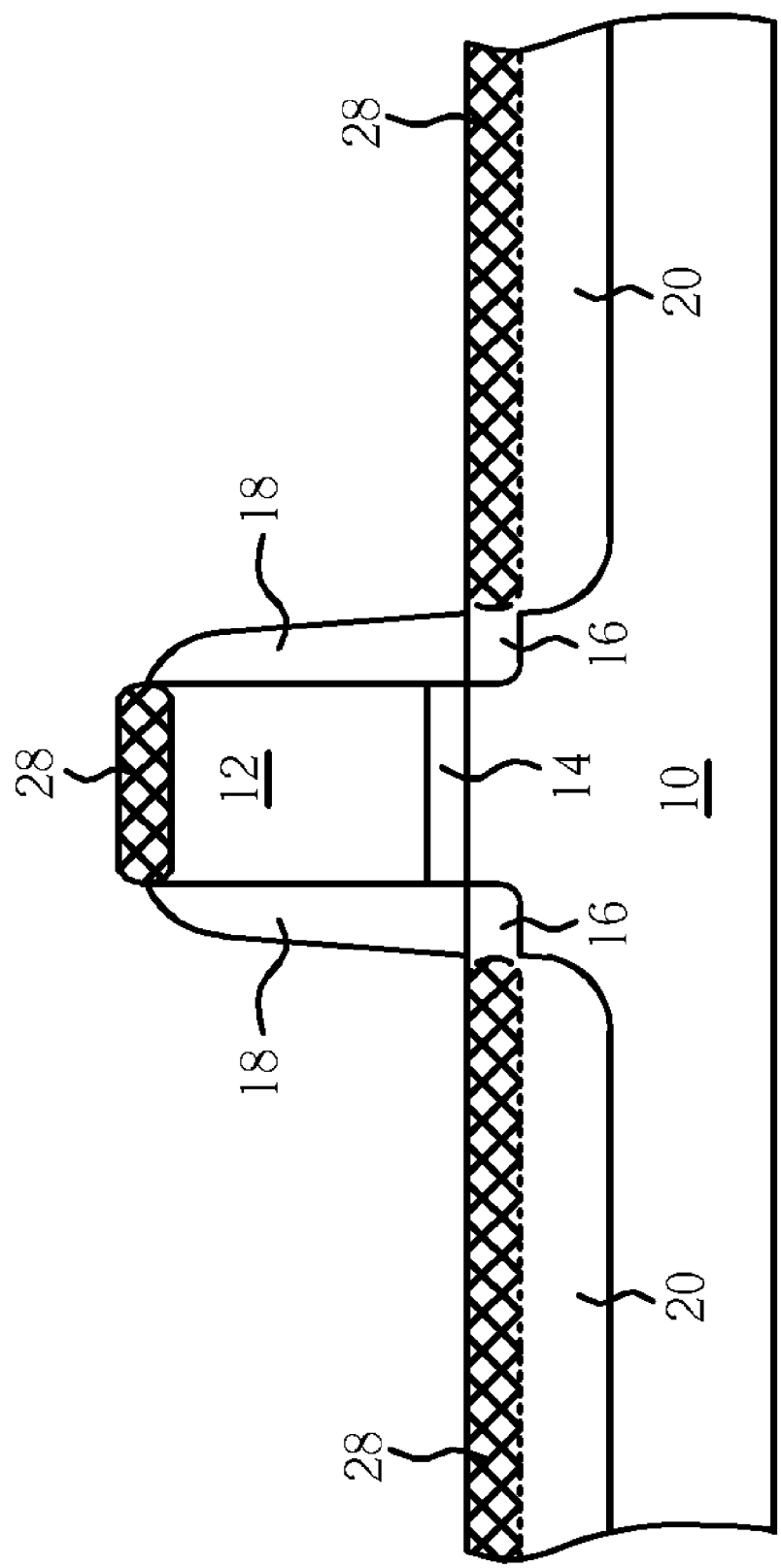
Figure 5:
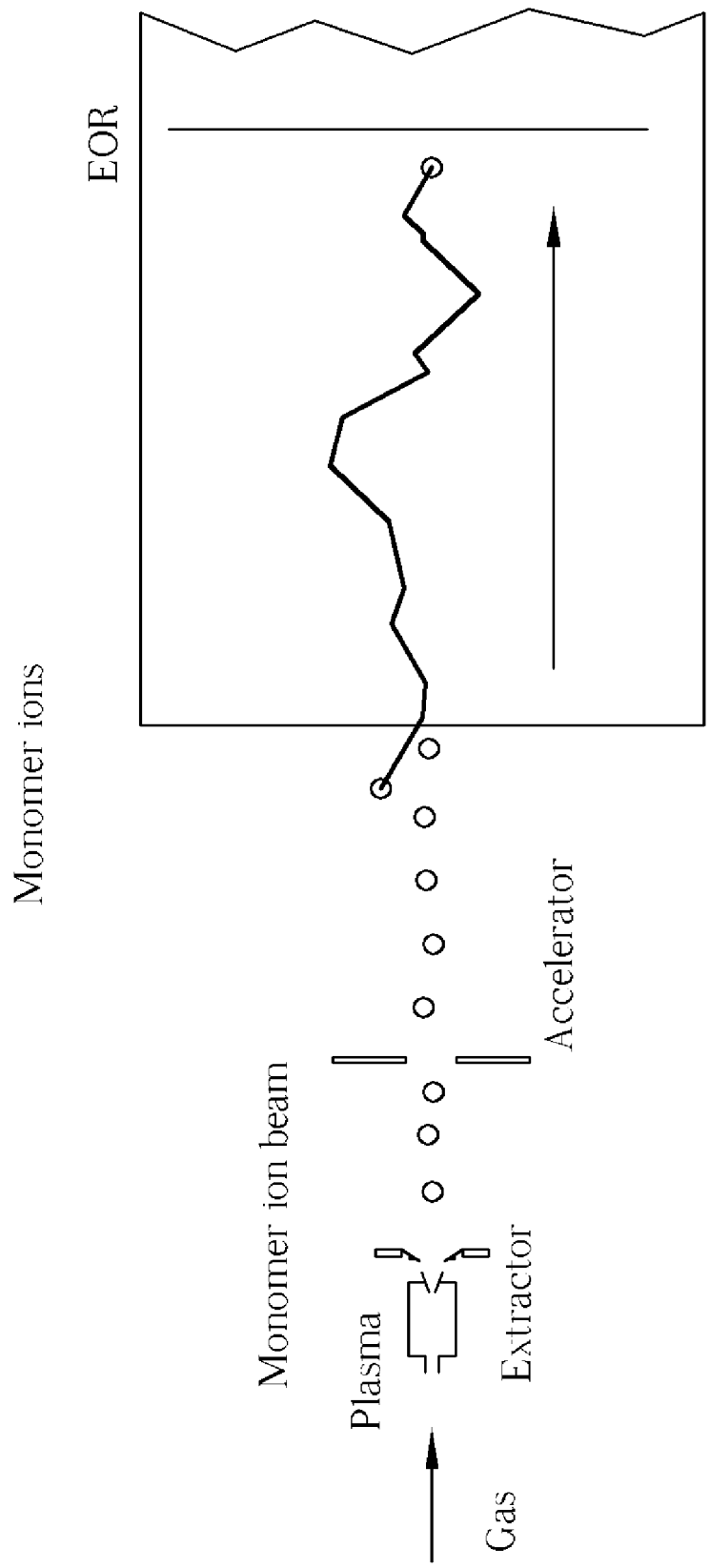
FIG. 5 is a schematic diagram of a PAI method utilizing monomer ion beam method according to the prior art.
Figure 6:
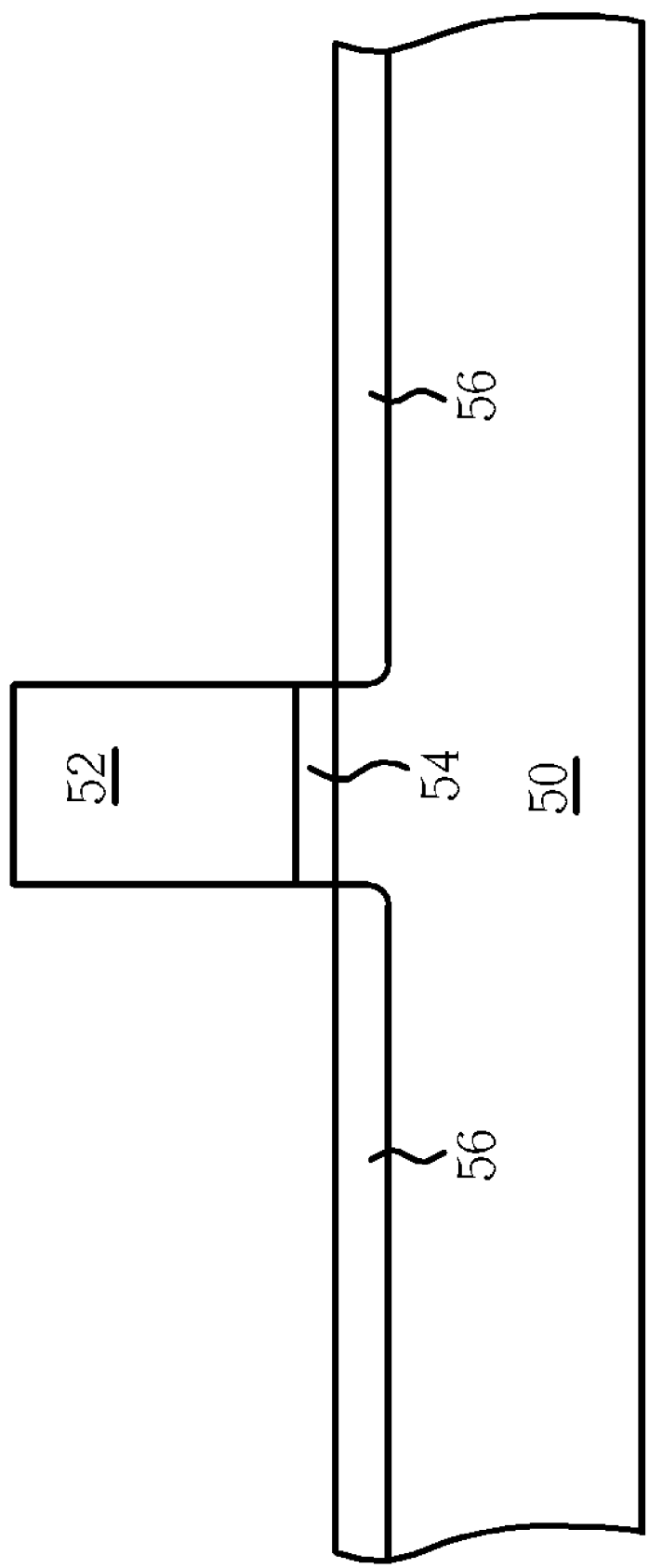
FIGS. 6-11 are schematic diagrams of a salicide process according to a first embodiment of the present invention.

With reference to FIGS. 6-11, FIGS. 6-11 are schematic diagrams of a salicide process according to a first embodiment of the present invention. As shown in FIG. 6, a semiconductor substrate 50 is provided, and a gate electrode 52 and a gate insulating layer 54 are formed on the semiconductor substrate 50, wherein the semiconductor substrate 50 may be a silicon substrate. Then, a first ion implantation process is performed to form source/drain extensions 56 in the semiconductor substrate 50 at two sides of the gate electrode 52.

Figure 7:
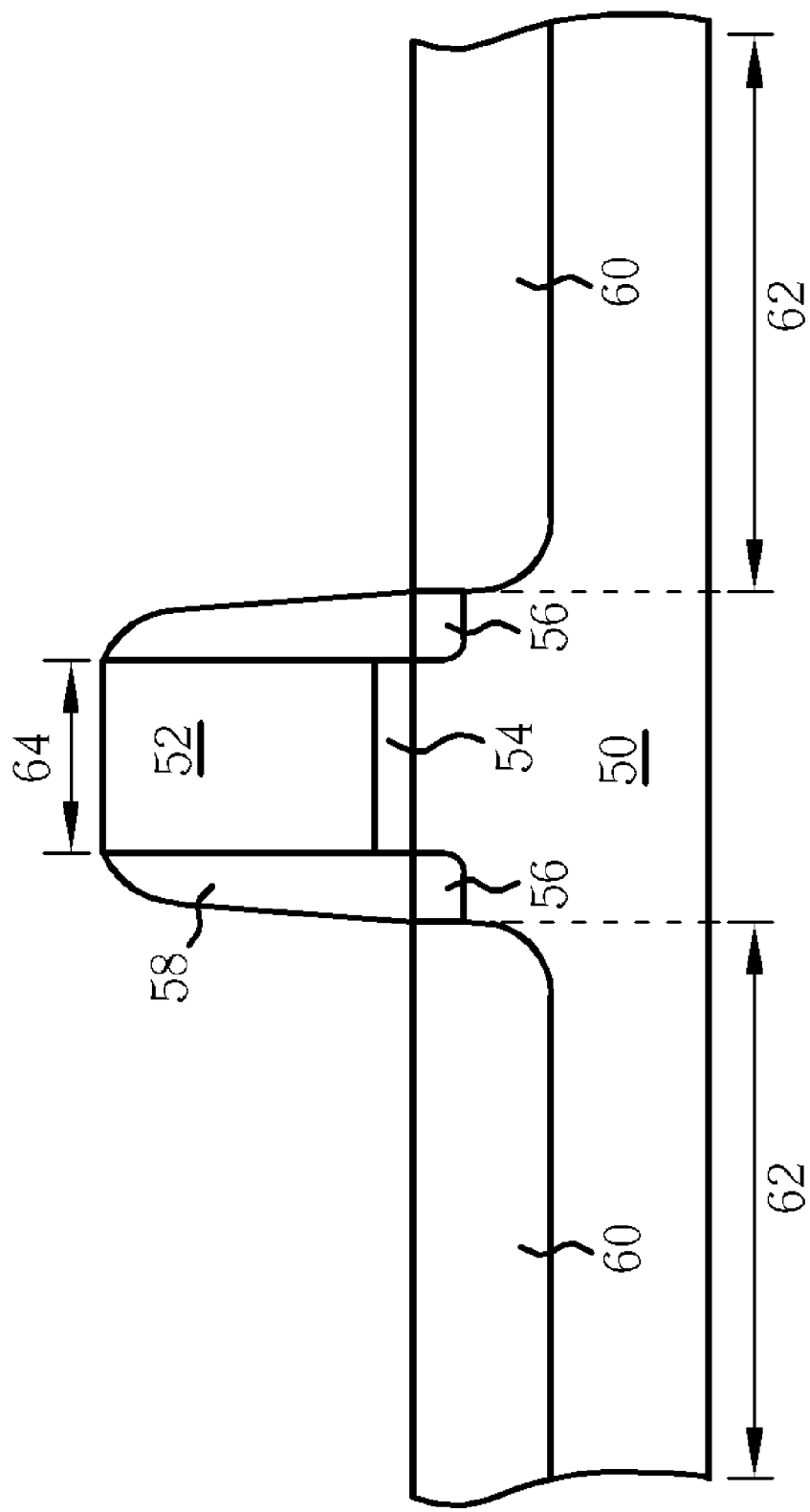

Referring to FIG. 7, a nitride layer (not shown) is deposited on the semiconductor substrate 50. Thereafter, a dry etching process or an anisotropic etching process is performed to removing portions of the nitride layer so as to form spacers 58 on the sidewall of the gate electrode 52 and the gate insulating layer 54. Next, the gate electrode 52 and the spacers 58 are utilized as masks to perform a second ion implantation process for forming the source/drain regions 60 in the substrate 50. For forming a P-type MOS (PMOS) transistor, the dopants of the second ion implantation process may comprise boron (B), indium, or other IIIA-group elements. On the other hand, the dopants of the second ion implantation process may comprise phosphorous (P), arsenic (As), or other VA-group elements when forming an N-type MOS (NMOS).

For lowering the contact resistivity of the source/drain regions 60 and the gate electrode 52, silicide layers are predetermined to be formed on the surface of the source/drain regions 60 and the gate electrode 52. Therefore, the semiconductor substrate 50 comprises at least a predetermined salicide region 62 thereon, while the top surface of the gate electrode 52 is another predetermined salicide region 64.

Figure 8:
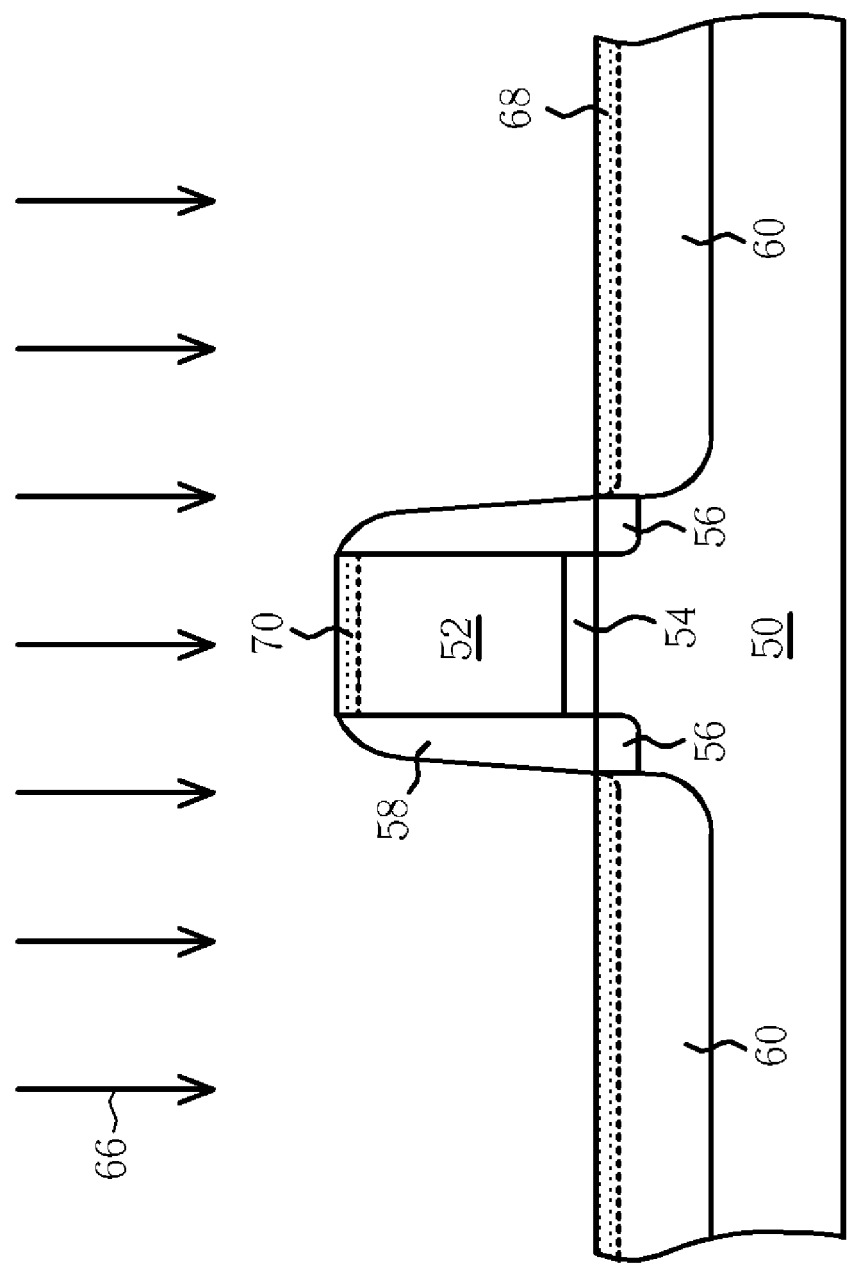
Figure 9:
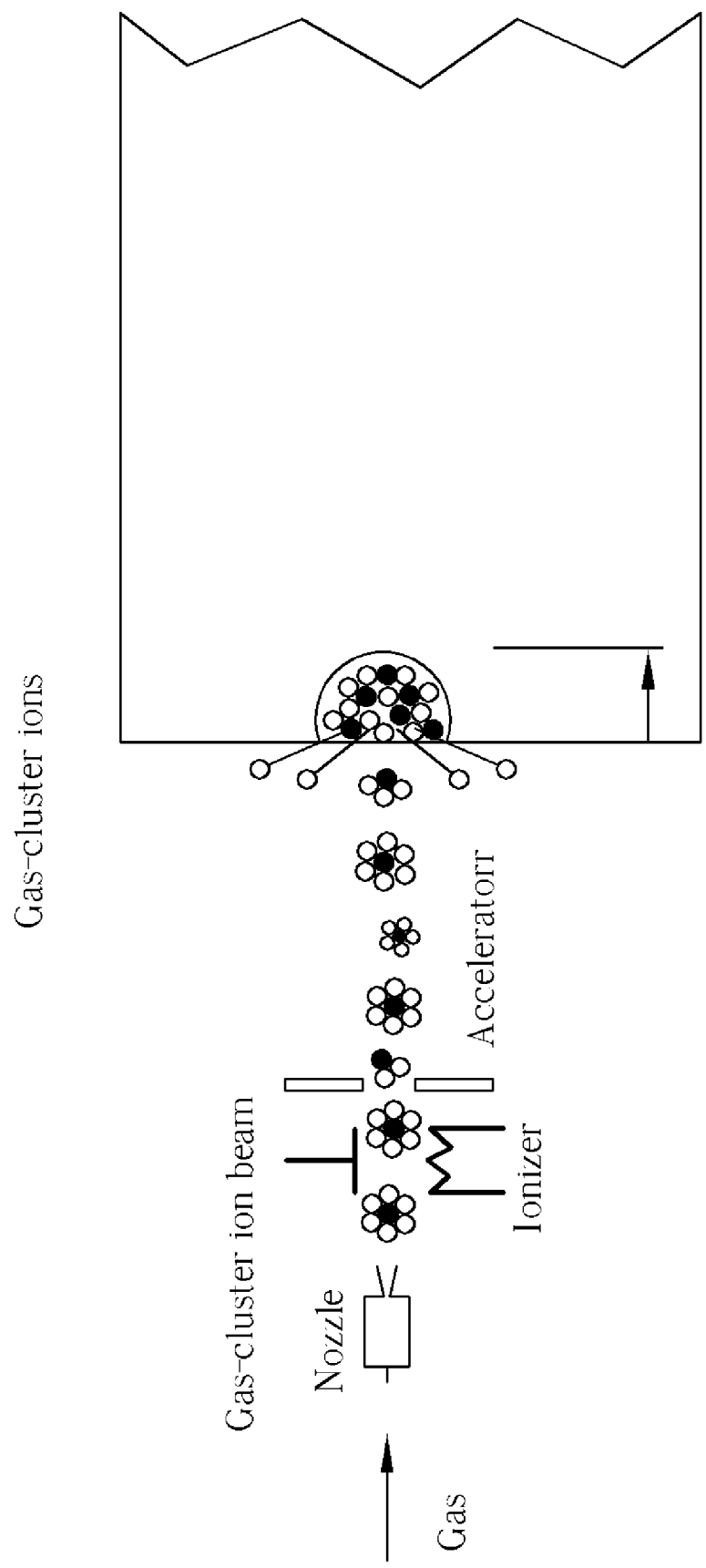

Next, referring to FIG. 8, a cluster ion implantation process 66 is performed to form amorphized layers 68 in the predetermined salicide regions 62, 64 of the semiconductor substrate 50, near the gate electrode 52 and the surface of the semiconductor substrate 50. When the gate electrode 52 is formed with polysilicon materials, an amorphized layer 70 is also formed on the top surface of the gate electrode 52. It should be noted that the depths of the amorphized layers 68, 70 which are formed through a cluster ion implantation process are shallower than that of the amorphized layer formed by a traditional PAI process in the prior art.

The cluster ion implantation process may be performed by a molecular ion implantation method or a gas cluster ion beam (GCIB) method. Since the ions of the cluster ion implantation process are implanted into the semiconductor substrate 50 as cluster types, their implantation energy is smaller than that in the traditional PAI process of the prior art. Therefore, the implantation depth of the cluster ion implantation of the present invention is smaller than that in the prior art. Accordingly, the amorphized layers 68, 70 have shallow depths. In this embodiment, the depth of the amorphized layers 68 may be about 0-30 micrometers ($\mu$m), specifically about 0-20 $\mu$m. Taking the GCIB as an example, referring to FIG. 9, gas is sent into a nozzle and to be jetted through an ionizer and an accelerator to form a gas cluster ion beam for implanting into the substrate. Clusters implanting into the substrate have thousands of atoms, and may have multiple species if desired. Therefore, most the cluster ions are stayed in the portion of the substrate with a small depth which is enough for the desired amorphized layers 68, 70 but without TDDB risks.

The cluster ion implantation process implants ions into the semiconductor substrate 50, which may comprise germanium (Ge), xenon (Xe) or argon (Ar). In various embodiments, the ions implanted in to the semiconductor substrate 50 comprise acceptors or donors which is the same as the elements during the above-mention ion implantation processes, such as boron, indium, phosphorous or arsenic.

Figure 10:
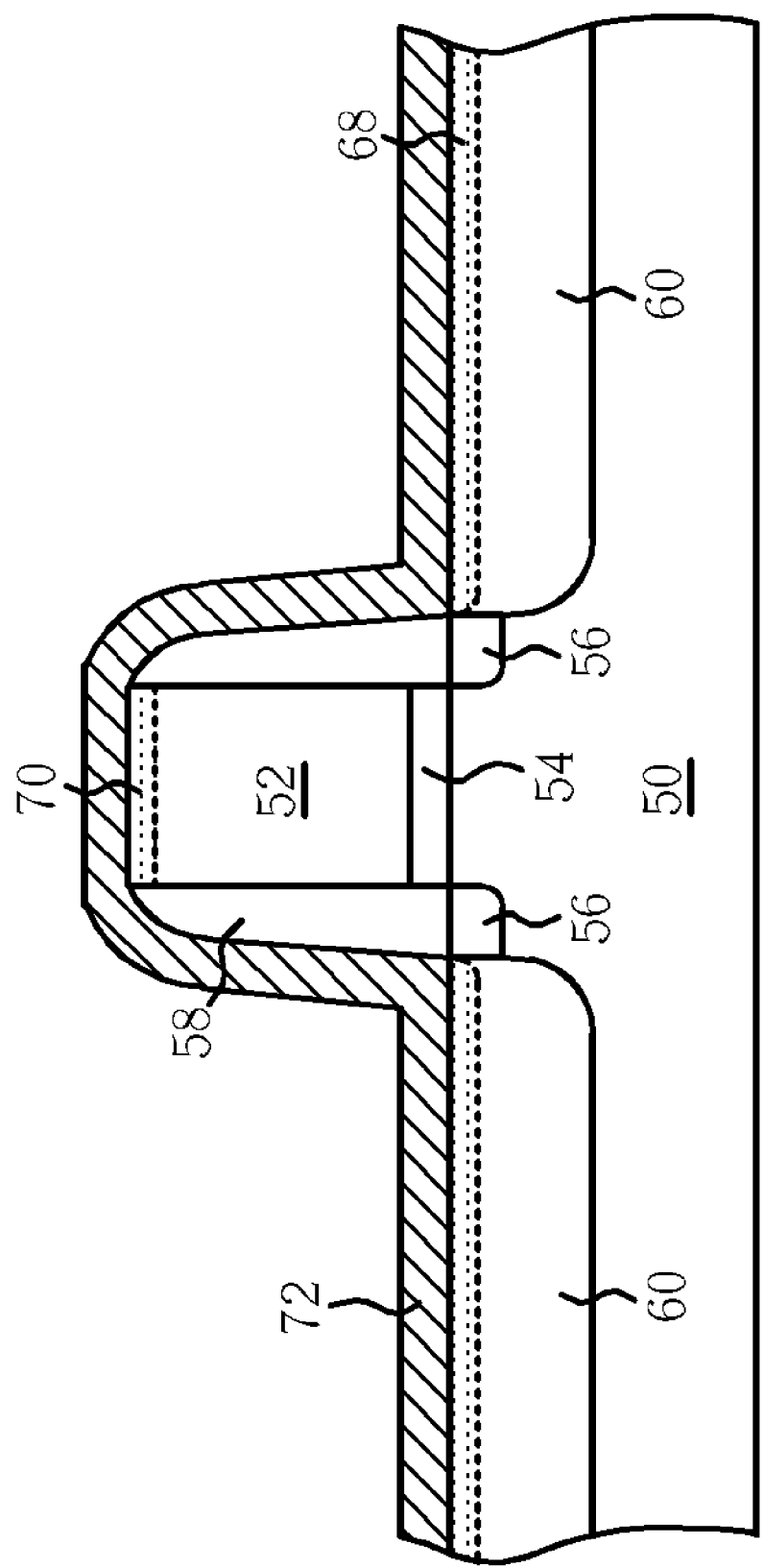
Figure 11:
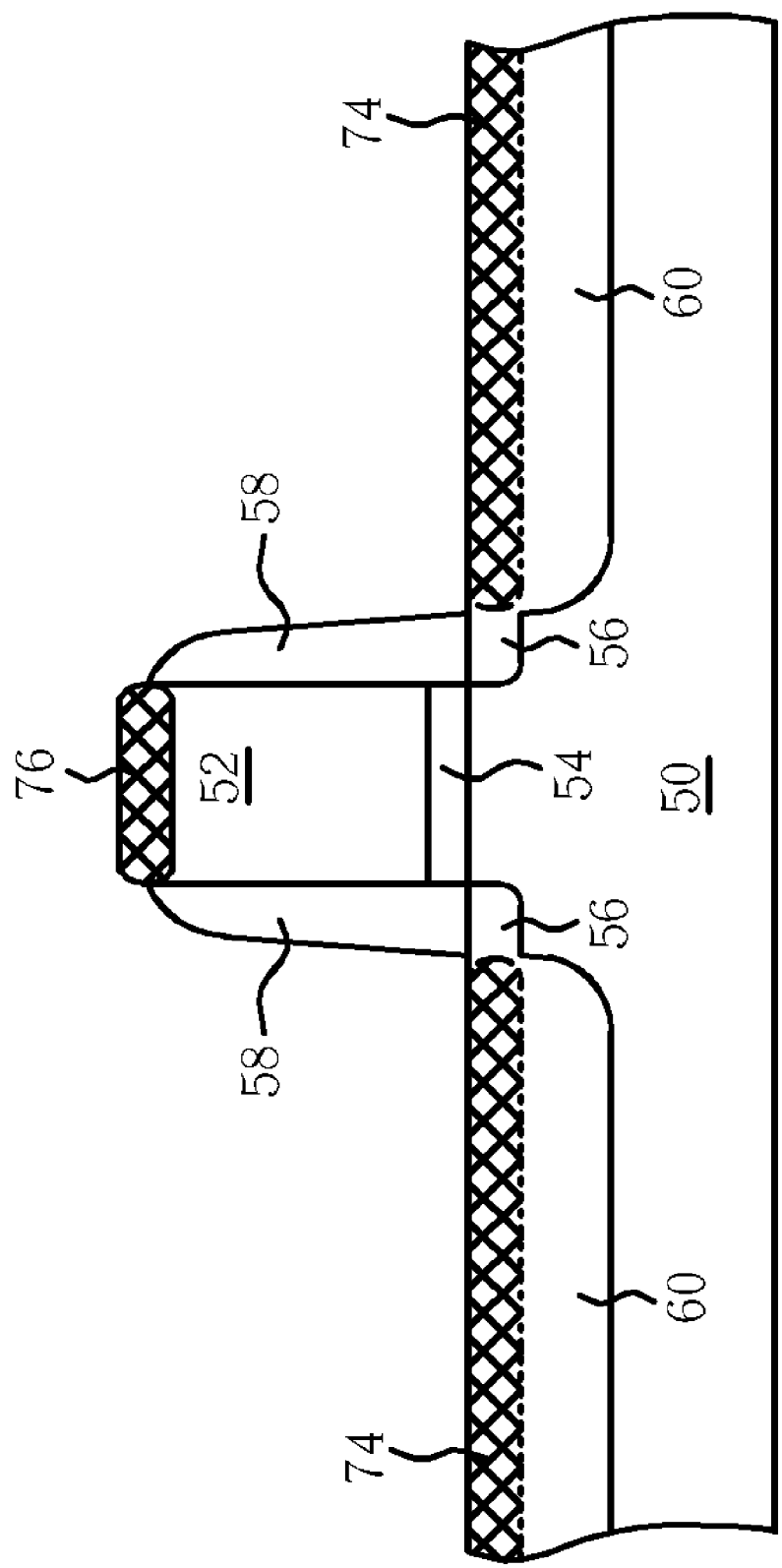

Thereafter, a self-aligned silicide (salicide) process is performed. Referring to FIG. 10, during the salicide process, a metal layer 72 is formed on the semiconductor substrate 50, wherein the metal layer 72 may be fabricated through a sputter process or a deposition process. The material of the metal layer 72 is capable of forming a silicide material. The metal layer 72 covers and directly contacts the amorphized layers 70, 68. The metal layer 72 may comprise nickel (Ni) or other metal being capable of forming a silicide material, such as titanium, tungsten, cobalt, platinum and palladium. With reference to FIG. 11, a first rapid thermal process (RTP) is performed to react the metal layer 72 with the amorphized layers 68, 70 so as to form silicide layers 74, 76 on the source/drain regions 60 and the gate electrode 52 respectively. Then, the semiconductor substrate 50 is cleaned to remove the un-reacted metal. If necessary, a second RTP is performed to convert the quality of silicide layers 74, 76 so that the silicide layers 74, 76 may have lower resistivity. Wherein, the first or the second RTP may be low-temperature treatments.

Figure 12:
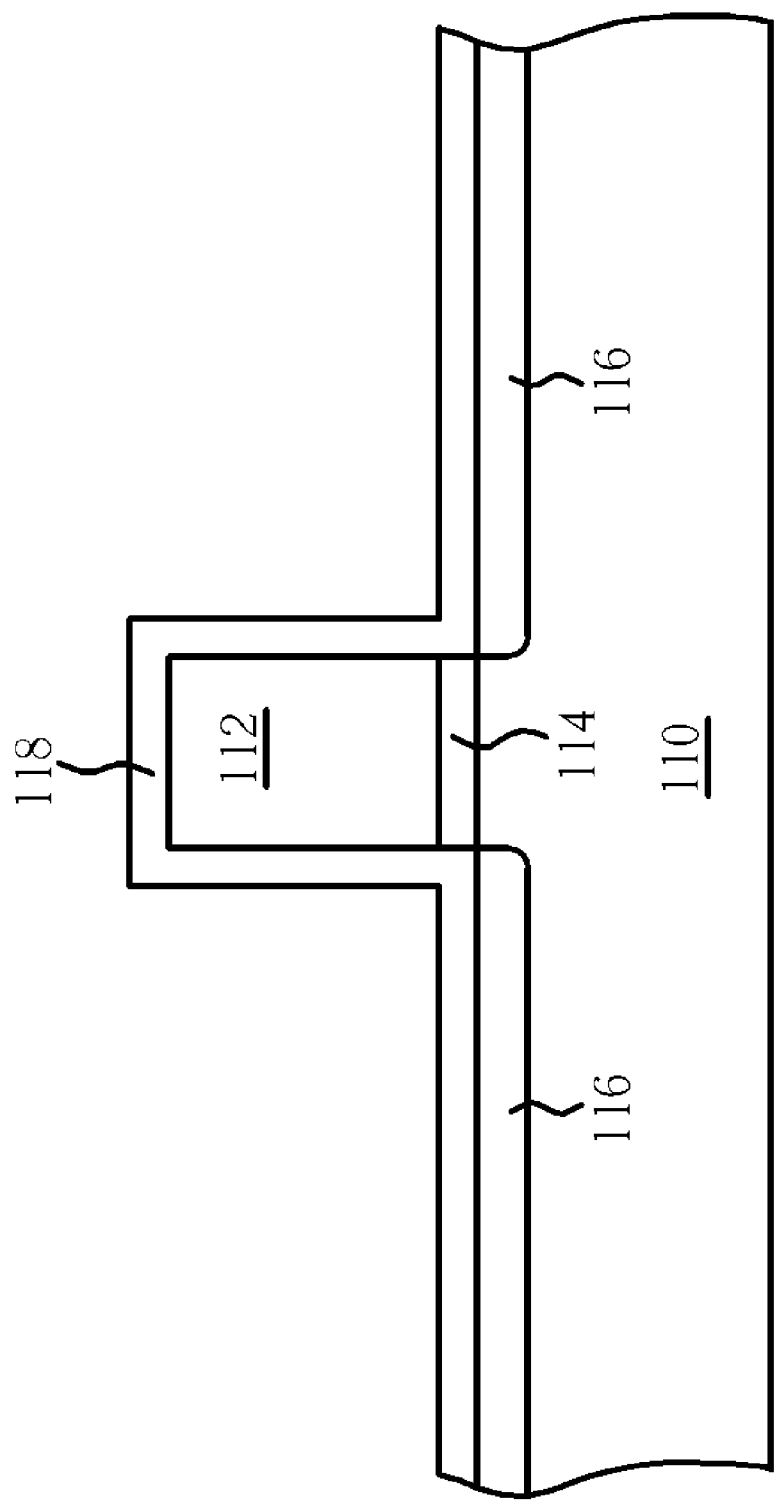
FIGS. 12-16 are schematic diagrams of a method of forming a MOS transistor according to a second embodiment of the present invention.

Please refer to FIGS. 12-16, which are schematic diagrams of a method of forming a metal-oxide semiconductor (MOS) transistor according to a second embodiment of the present invention. As shown in FIG. 12, a gate electrode 112 is formed on a substrate 110 with a gate insulating layer 114 interposed therebetween. A lining layer 118, preferably a silicon dioxide layer, is then deposited over the top surface and sidewalls of the gate electrode 112, and on the exposed surface of the substrate 110. An ion implantation process is carried out to implant dopant into the substrate 110 so as to form shallow junction source/drain extensions 116.

Figure 13:
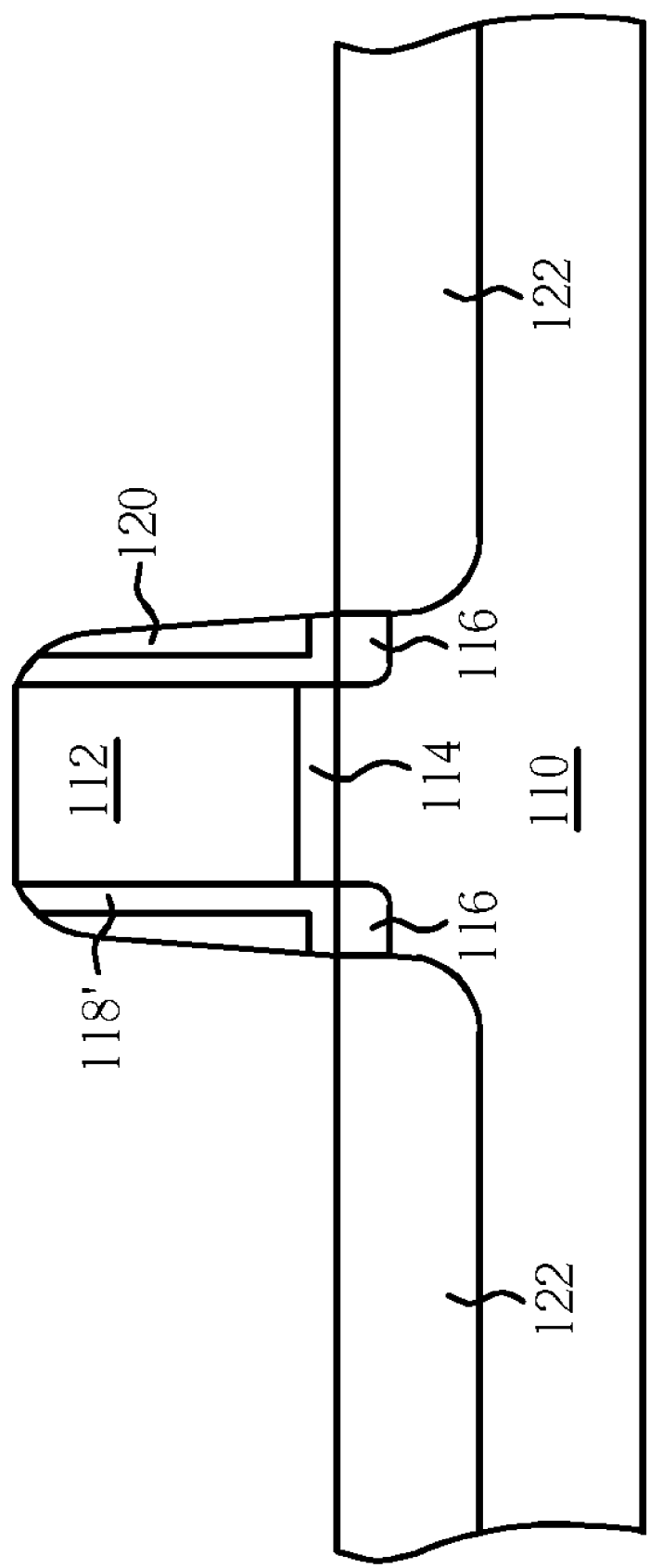

As shown in FIG. 13, a layer of silicon nitride (not shown) is deposited on the lining layer 118. An anisotropic dry etching is then carried out to etch the silicon nitride layer and the lining layer 118, thereby forming a pair of silicon nitride spacers 120 and an L-shaped liner layer 118' on the sidewalls of the gate electrode 112. Subsequently, a high-dosage ion implantation is conducted to form deep source/drain regions 122 in the substrate 110.

Figure 14:
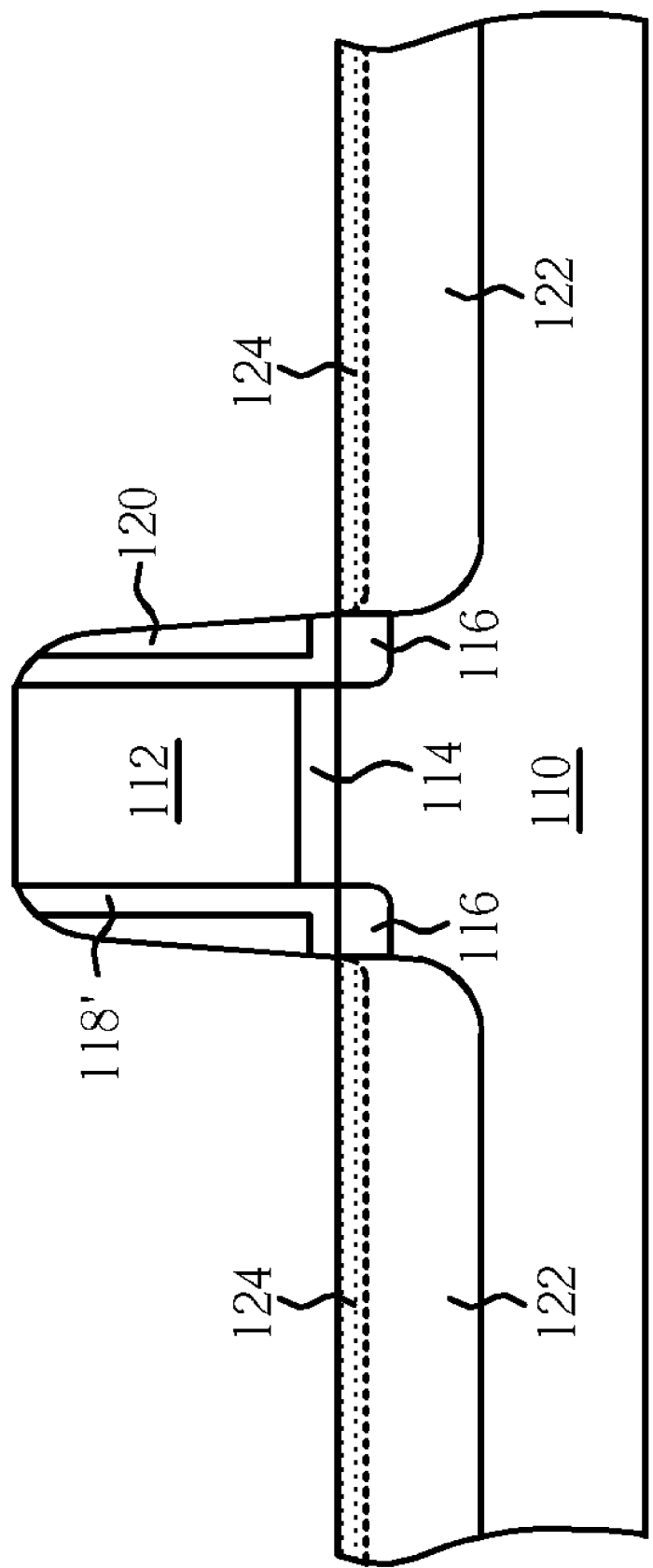

As shown in FIG. 14, a wet pre-clean process is conducted to remove unwanted substances such as particles or native oxide from the surface of the substrate 110. After the wet pre-clean process, a cluster ion implantation process is performed to form an amorphized layer 124 in the substrate 120, next to the gate electrode 112 and near the surface of the substrate 120. The cluster ion implantation process is accomplished by implanting an amorphizing substance cluster such as Ge, Xe or Ar into the substrate 110. However, the amorphizing substance cluster may comprise acceptors or donors which are the same as the elements during the ion implantation process or the high-dosage ion implantation in various embodiments. In another case, the wet pre-clean may be carried out after the cluster ion implantation process. On the other hand, an amorphized layer (not shown) may also be formed on the top surface of the gate electrode 112 during the cluster ion implantation process.

Figure 15:
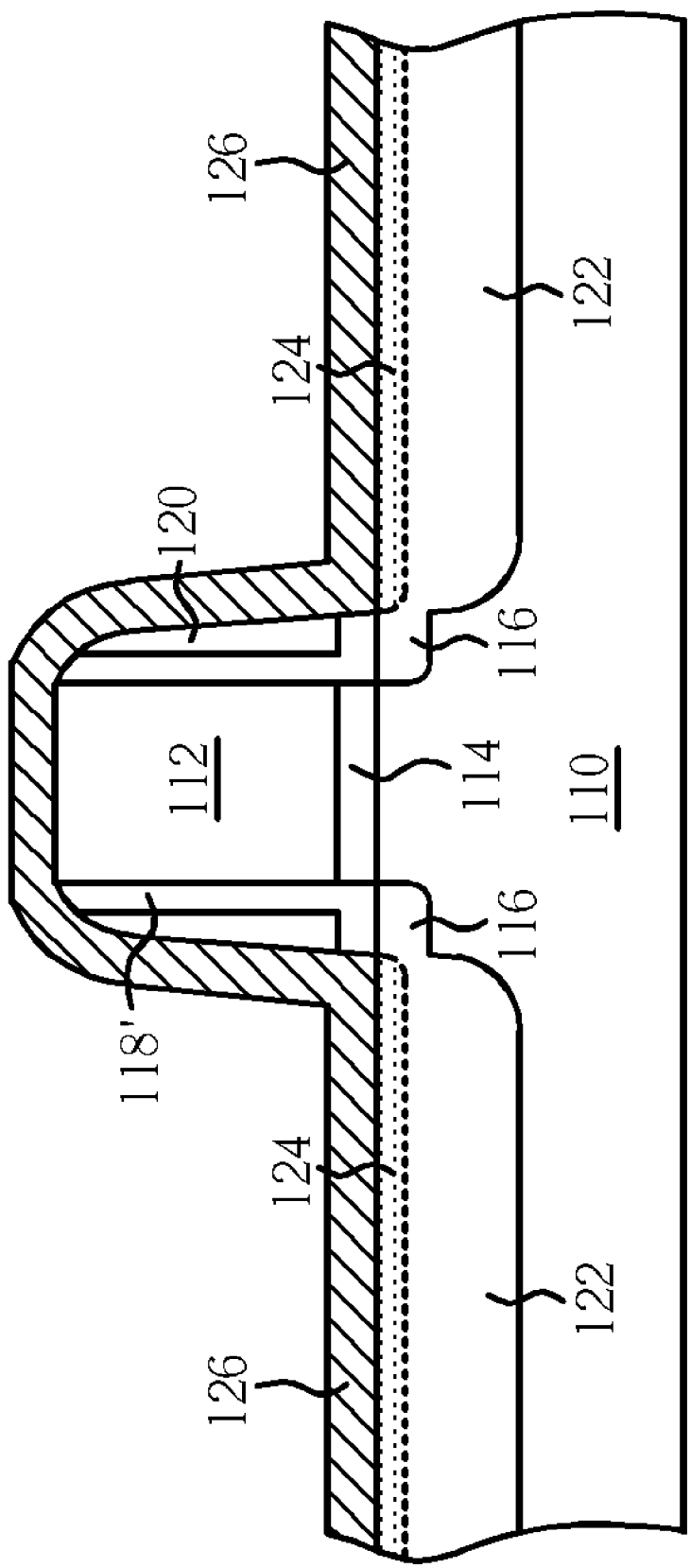
Figure 16:
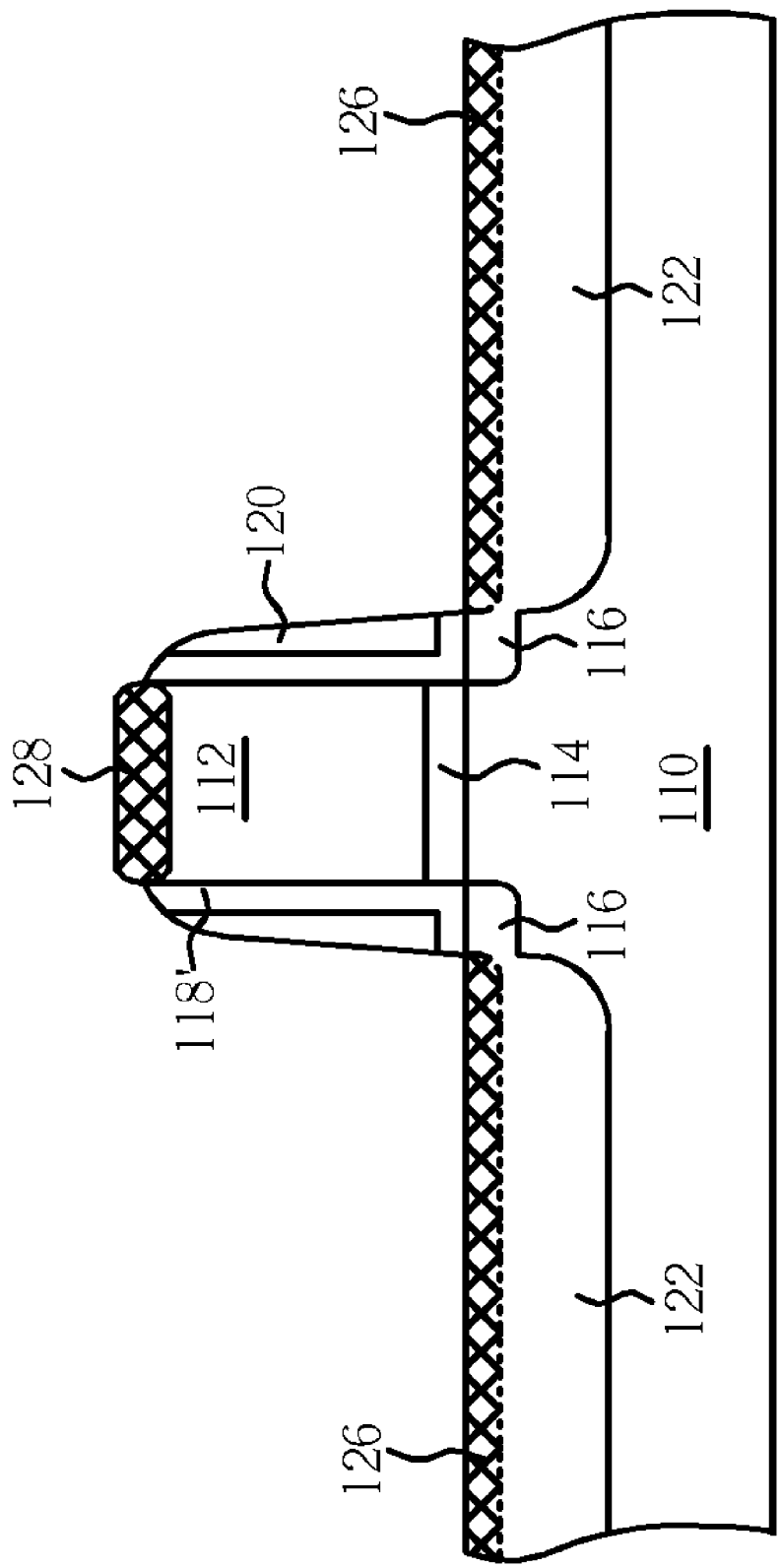

As shown in FIG. 15, a metal layer 126 such as nickel, platinum, palladium, molybdenum or any alloy thereof is then blanket sputtered onto the substrate 110. As shown in FIG. 16, a thermally treatment process is performed so that the metal layer 126 reacts with the substrate 110 and the gate electrode 112 to form silicide layers 126, 128 such as nickel silicide (NiSi). The un-reacted metal is then removed from the substrate 110 by wet etching.

Figure 17:
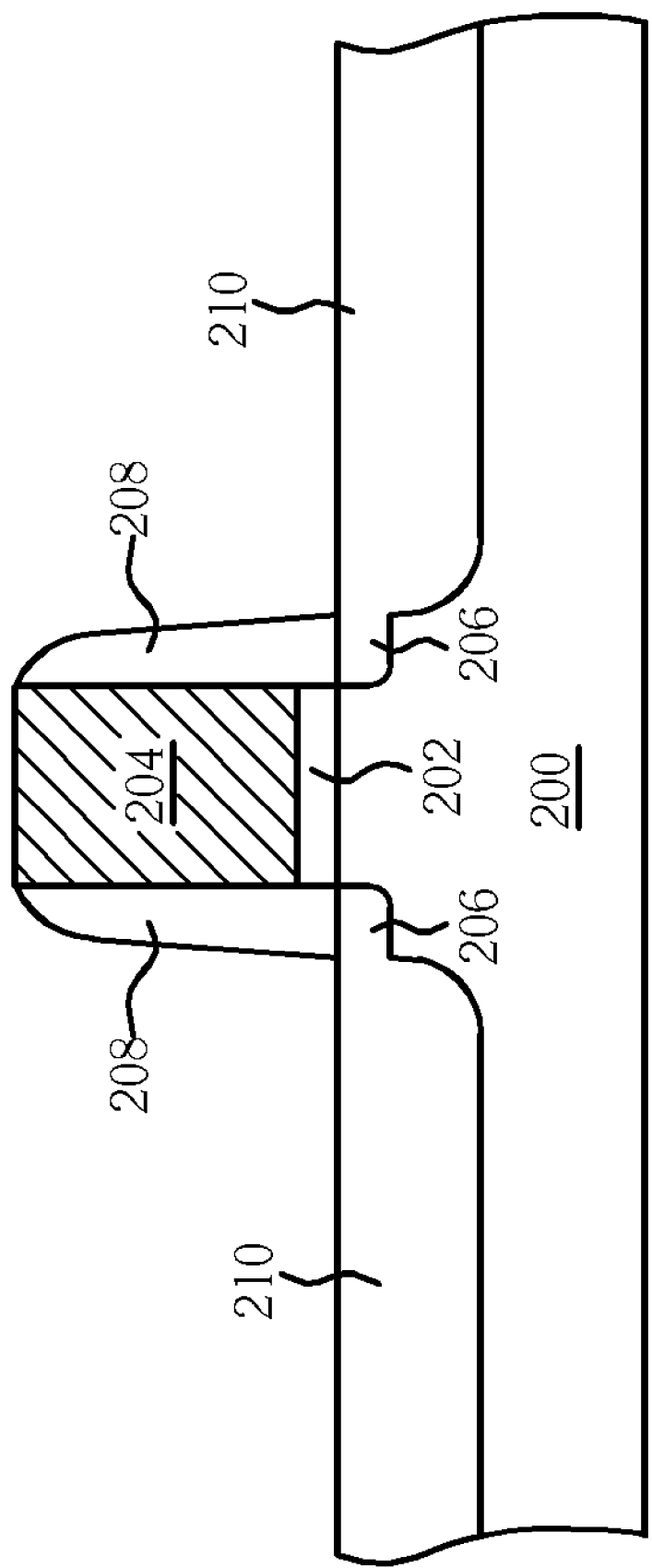
FIGS. 17-21 are schematic diagrams of a method of forming a MOS transistor according to a third embodiment of the present invention.

FIGS. 17-21 are schematic diagrams of a method of forming a MOS transistor according to a third embodiment of the present invention. Referring to FIG. 17, a substrate 200 such as P-type substrate is provided. Then, a gate oxide layer 202 functioning as a gate insulating layer and a polysilicon gate 204 are formed on the substrate 200. The gate oxide layer 202 is provided by defining an oxide layer formed by thermal oxidation. The polysilicon gate 204 is deposited by low pressure chemical vapor deposition (LPCVD) and is doped to render the polysilicon conductive.

Next, the substrate 200 is doped to form source/drain regions 210 in the substrate 200 and to define a channel of a MOS transistor. The formation process of the source/drain regions 210 may comprise a step of implanting an impurity, for example, phosphorus with low dosage, through the polysilicon gate 204 as a mask to form lightly doped source/drain regions 206, a step of depositing a second oxide layer on the entire surface of the device and etching back to form the spacers 208 on the sides of the polysilicon gate 204 and the oxide layer 203, and a step of implanting an impurity, for example, phosphorus or arsenic with a heavy dosage through the polysilicon gate 204 and the spacers 208 as a mask to form heavily doped source/drain regions 210.

Figure 18:
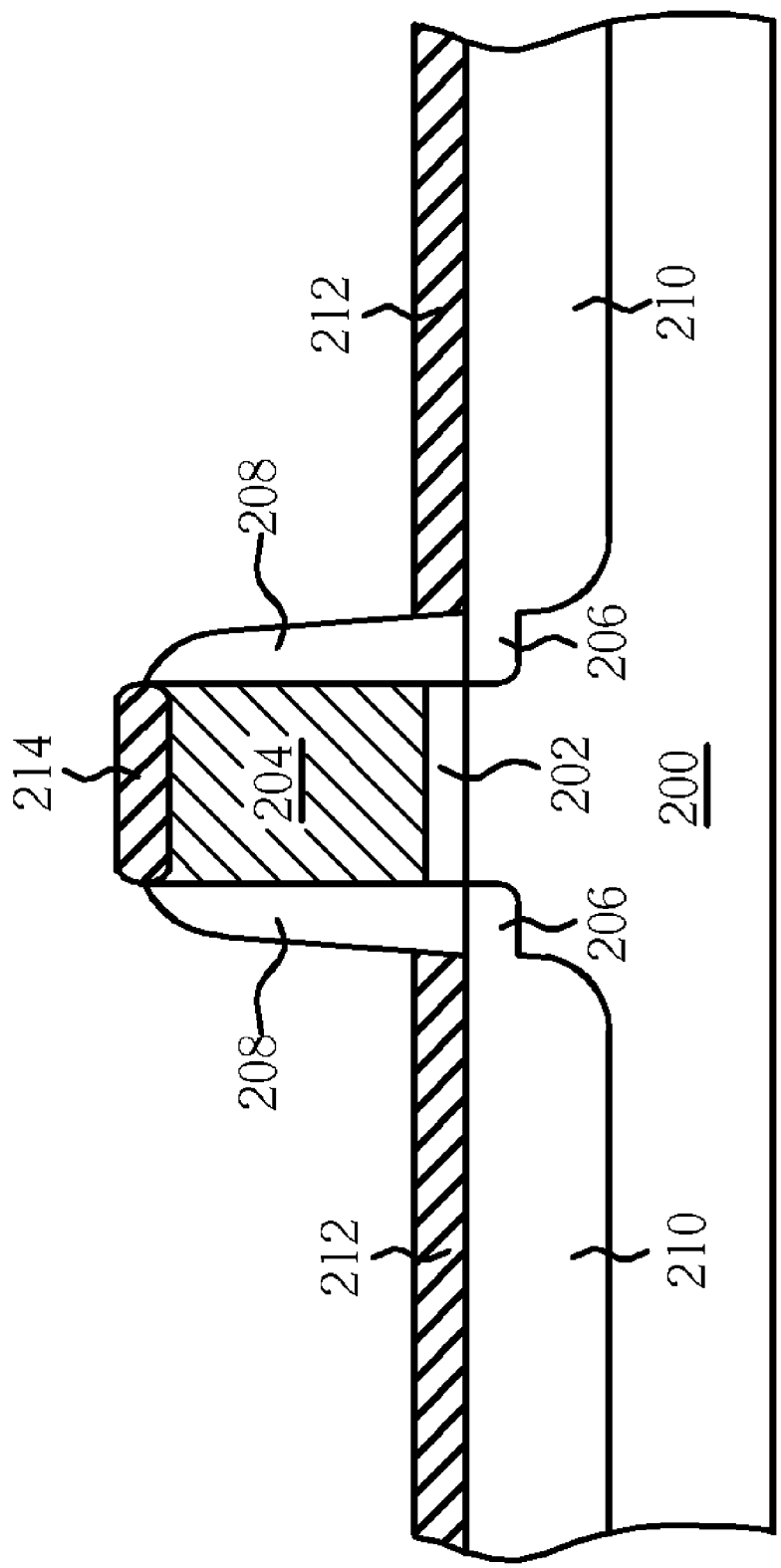
Figure 19:
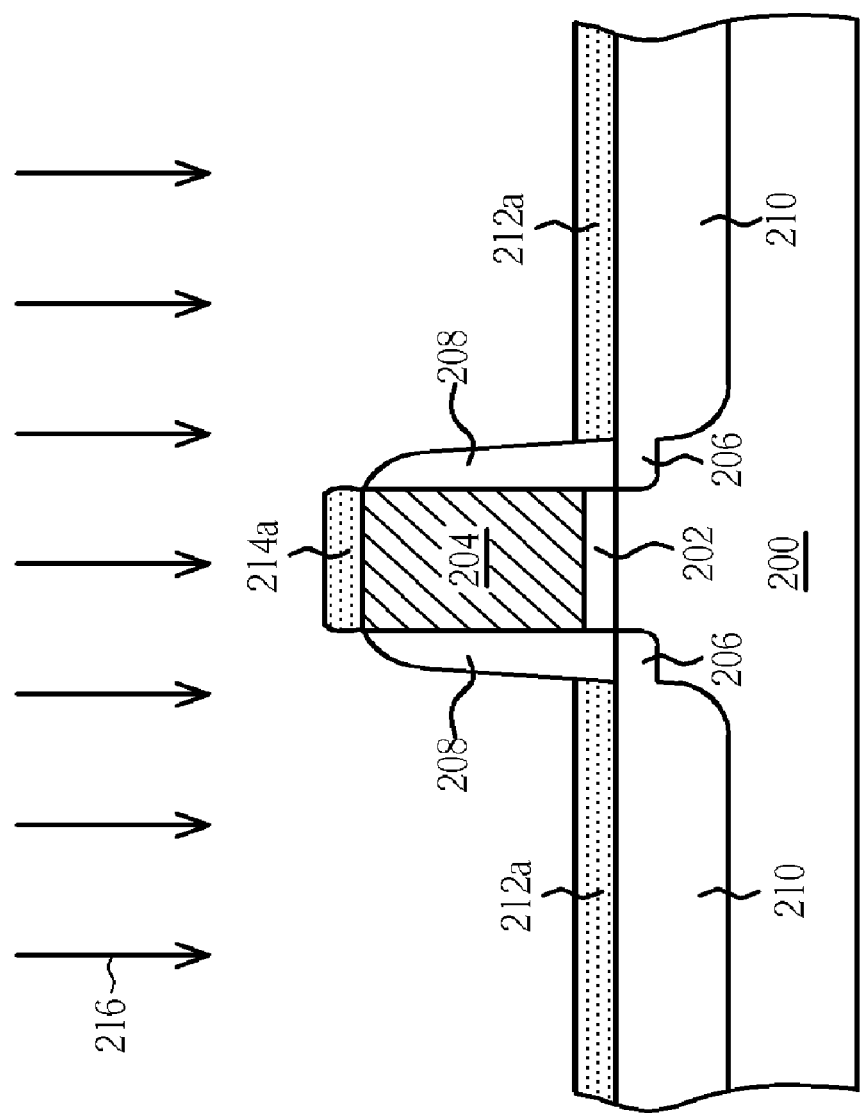

Referring to FIG. 18, a selective epitaxial growth process is performed twice, for example, to form amorphous silicon layers 214 and 212, respectively on the polysilicon gate 204 and the source/drain regions 210. Referring to FIG. 19, a cluster ion implantation process 216 is performed to form amorphized layers 214a and 212a on the polysilicon gate 204 and the source/drain regions 210 respectively, wherein the cluster ion implantation process 216 may be carried out by a GCIB method or a molecular ion implantation process.

Figure 20:
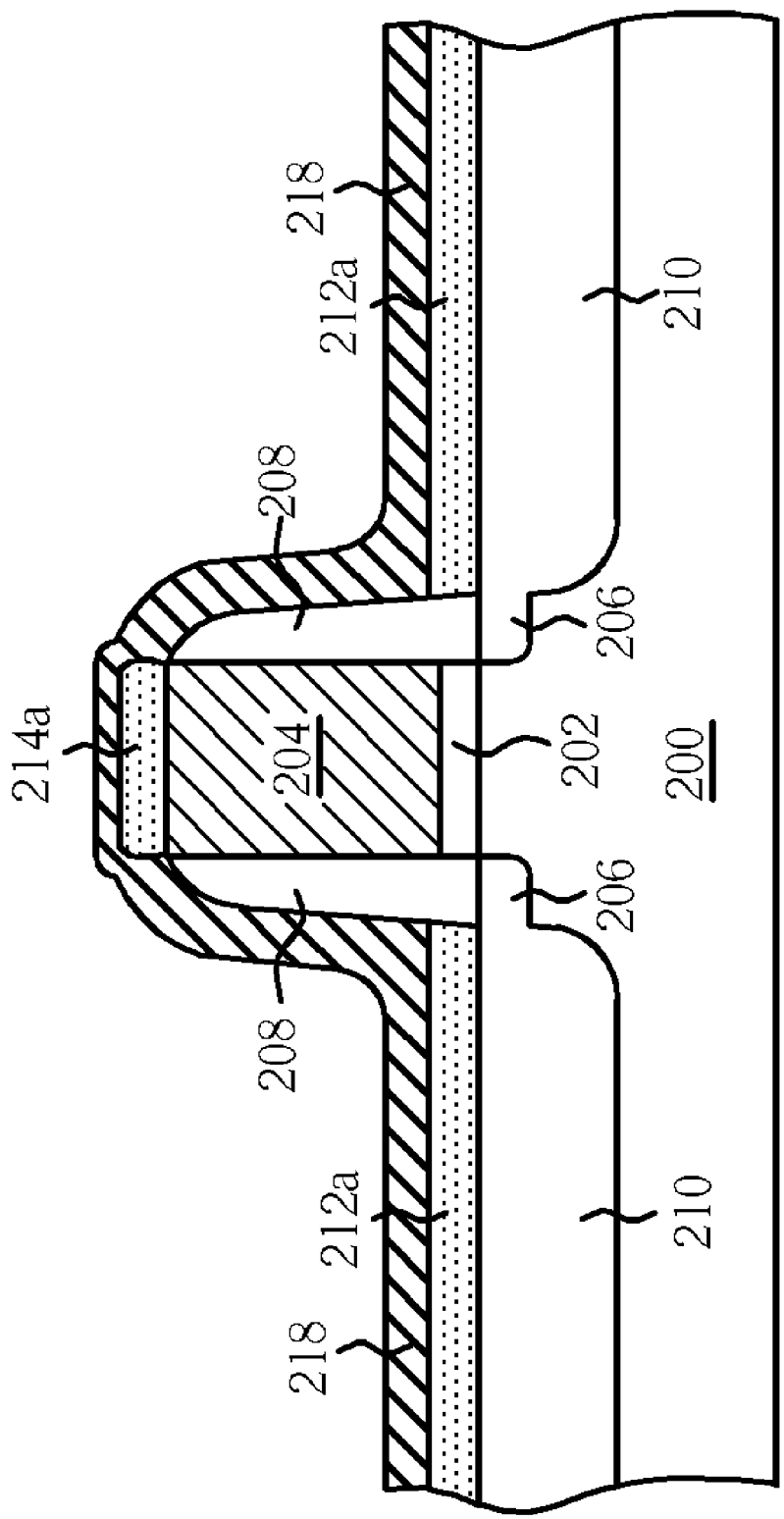
Figure 21:
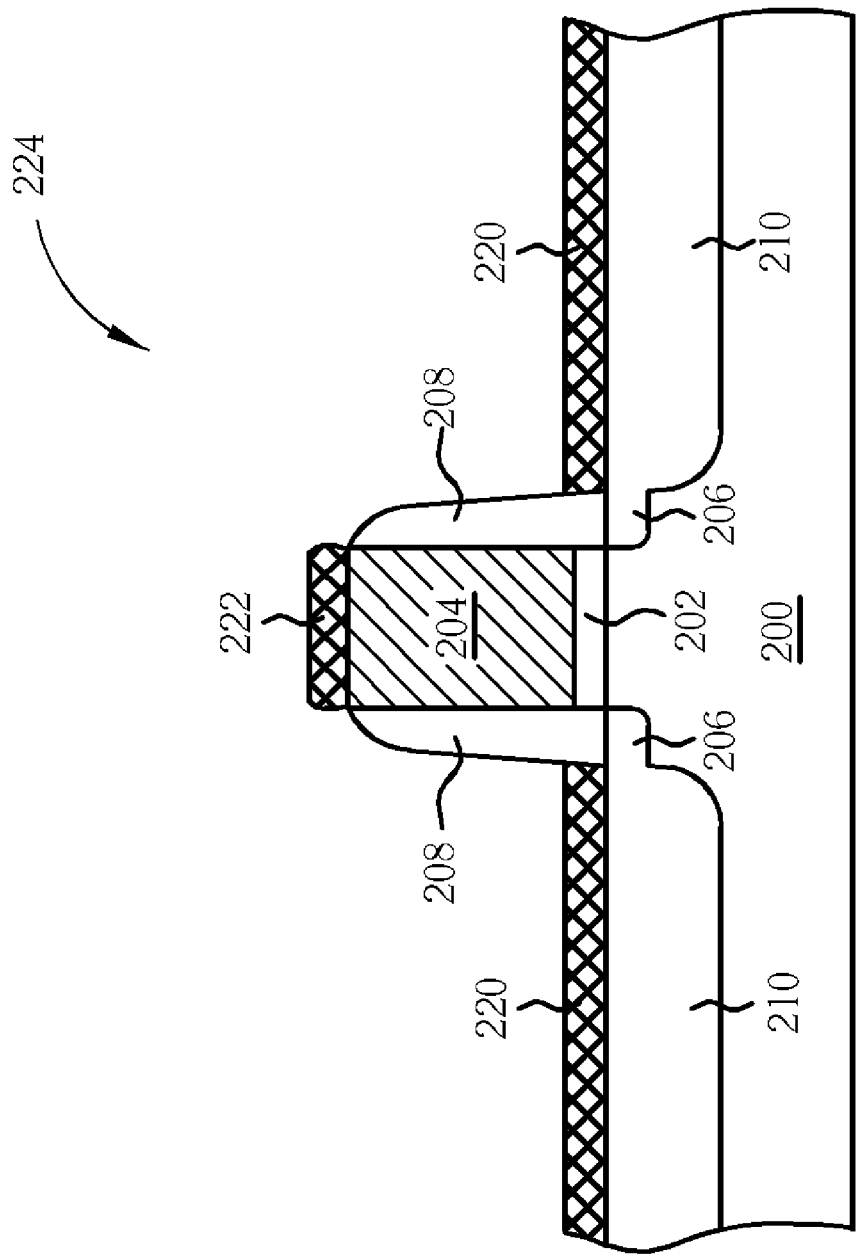

As shown in FIG. 20, a metal layer 218 is formed on the substrate 200. Then, a RTP process is conducted to form silicide layers 220, 222 with low resistivity on the amorphized layers 212a and 214a over the source/drain regions 210 and the polysilicon gate 204. A subsequent etching removes the un-reacted metal from the surface of the device to complete the fabrication of the MOS transistor 224, as shown in FIG. 21.

Figure 22:
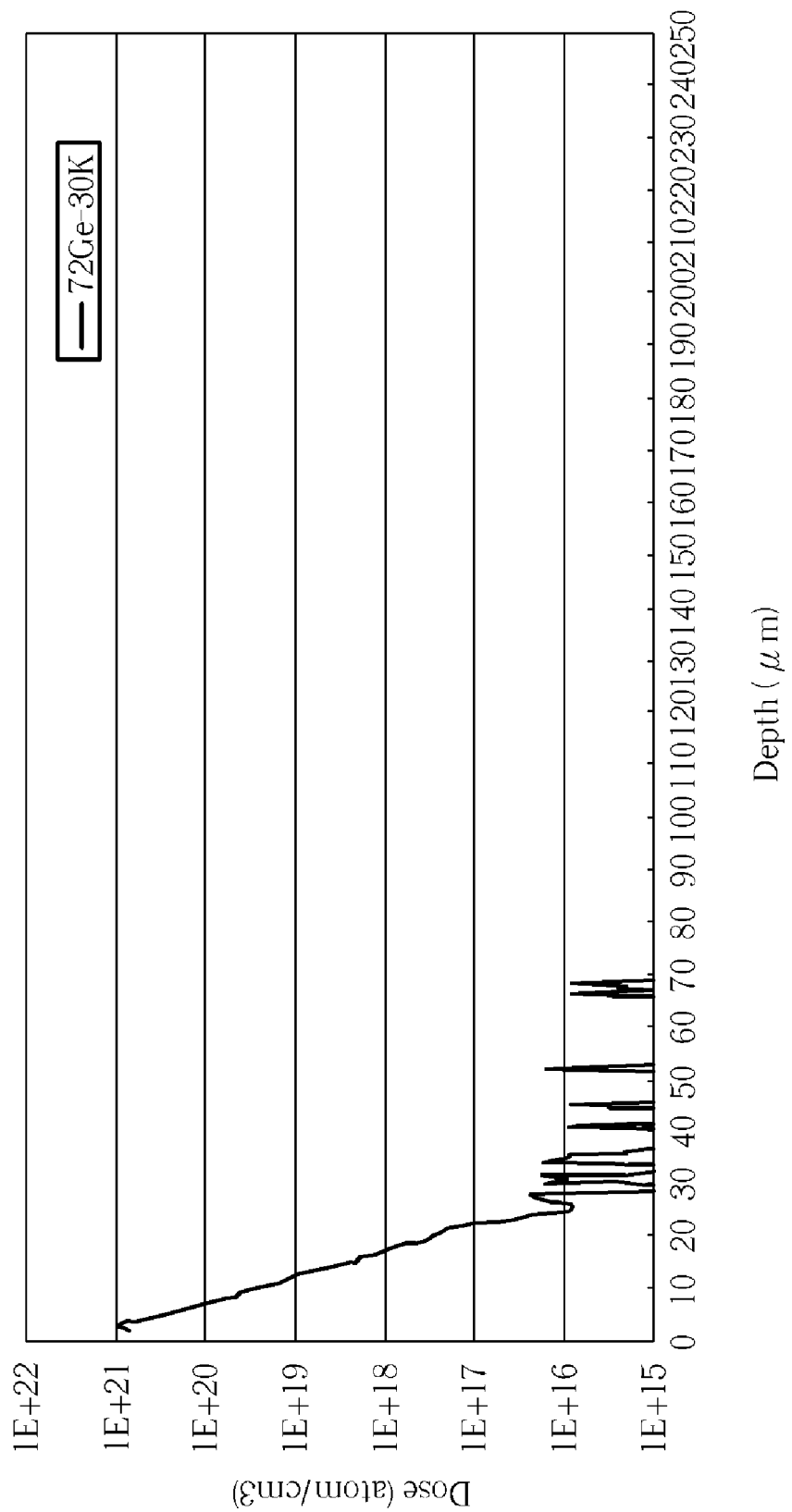
FIG. 22 is an implantation profile of Ge according to the GCIB method of the present invention.

FIG. 22 is an implantation profile of Ge according to the GCIB method of the present invention. As shown in FIG. 22, the Ge atoms are stayed in the depth of about 0-70 µm, and most Ge atoms are in the depth of about 0-30 µm, specifically about 0-20 µm. Therefore, the amorphized layers 68, 124, 212a or 214a formed with the cluster ion implantation process, such as GCIB, have small depths, which do not damage the semiconductor substrate or gate for tailing effect and have enough depths without TDDB fail risk.

In contrast to the prior art, cluster ion implantation process is utilized to form shallow amphorized layers before forming silicide layers according to the present invention. Accordingly, the amphorized layers are more uniform and have seldom EOR defects EOFR defects, which are easy to be recovered in low temperature treatment process. Therefore, the present invention provides MOS transistors with preferable quality of silicide layers and preferable performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-aligned silicide (salicide) process, comprising:
providing a silicon substrate that comprises at least a predetermined salicide region;
performing a cluster ion implantation process to form an amorphized layer in the predetermined salicide region of the silicon substrate;
forming a metal layer on the surface of the amorphized layer, the material of the metal layer being capable of forming a silicide material; and
reacting the metal layer with the amorphized layer to form a silicide layer on the surface of the silicon substrate.

2. The salicide process of claim 1, wherein the cluster ion implantation process is performed with a molecular ion implantation method.

3. The salicide process of claim 1, wherein the cluster ion implantation process is performed with a gas cluster ion beam (GCIB) method.

4. The salicide process of claim 1, wherein the cluster ion implantation process implants materials that function as donors or acceptors.

5. The salicide process of claim 1, wherein the cluster ion implantation process implants materials comprising argon (Ar) or germanium (Ge).

6. The salicide process of claim 1, wherein the step of reacting the metal layer with the amorphized layer comprises a thermally treating process.

7. The salicide process of claim 6, wherein the thermally treating process comprises a rapid thermal process (RTP).

8. The salicide process of claim 6, wherein the thermally treating process is a low temperature treatment process.

9. A method of forming a metal-oxide semiconductor (MOS) transistor, comprising:
providing a semiconductor substrate comprising a gate electrode and a gate insulating layer thereon;
performing an ion implantation process to form source/drain regions in the semiconductor substrate near the gate electrode;
performing a cluster ion implantation process to form at least an amorphized layer in the source/drain regions, near the surface of the semiconductor substrate;

forming a metal layer on the surface of the amorphized layer, the material of the metal layer being capable of forming a silicide material; and reacting the metal layer with the amorphized layer to form a silicide layer on the surface of the semiconductor substrate.

10. The method of claim 9, wherein the cluster ion implantation process is performed with a molecular ion implantation method.

11. The method of claim 9, wherein the cluster ion implantation process is performed with a gas cluster ion beam method.

12. The method of claim 9, wherein the step of reacting the metal layer with the amorphized layer comprises a thermally treating process.

13. The method of claim 12, wherein the thermally treating process comprises a rapid thermal process (RTP).

14. The method of claim 12, wherein the thermally treating process is a low temperature treatment process.

15. The method of claim 9, wherein the cluster ion implantation process implants materials the same as the atoms utilized for forming the source/drain regions.

16. The method of claim 9, wherein the cluster ion implantation process implants materials that function as donors or acceptors.

17. The method of claim 9, wherein the cluster ion implantation process implants materials comprising argon (Ar) or germanium (Ge).

18. A method of forming a MOS transistor, comprising:
providing a substrate comprising a gate electrode and a gate insulating layer thereon;
performing an ion implantation process to form source/drain regions in the semiconductor substrate near the gate electrode;
forming at least an amorphous silicon layer on the source/drain regions by a selective epitaxial growth process;
performing a cluster ion implantation process to form at least an amorphized layer over the amorphous silicon layer;
forming a metal layer on the surface of the amorphized layer, the material of the metal layer being capable of forming a silicide material; and
reacting the metal layer with the amorphized layer to form a silicide layer on the surface of the gate electrode and the substrate.

19. The method of claim 18, wherein the cluster ion implantation process is performed with a molecular ion implantation method.

20. The method of claim 18, wherein the cluster ion implantation process is performed with a gas cluster ion beam method.

21. The method of claim 18, wherein the step of reacting the metal layer with the amorphized layer comprises a thermally treating process.

22. The method of claim 21, wherein the thermally treating process comprises a rapid thermal process (RTP).

23. The method of claim 21, wherein the thermally treating process is a low temperature treatment process.

24. The method of claim 18, wherein the cluster ion implantation process implants materials the same as the atoms utilized for forming the source/drain regions.

25. The method of claim 18, wherein the cluster ion implantation process implants materials that function as donors or acceptors.

26. The method of claim 18, wherein the cluster ion implantation process implants materials comprising argon (Ar) or germanium (Ge).

* * * * *